United States Patent
Nitta et al.

(10) Patent No.: US 8,993,121 B2
(45) Date of Patent: *Mar. 31, 2015

(54) METAL LAMINATED STRUCTURE AND METHOD FOR PRODUCING THE SAME

(75) Inventors: Koji Nitta, Osaka (JP); Shinji Inazawa, Osaka (JP); Akihisa Hosoe, Osaka (JP); Masatoshi Majima, Osaka (JP); Osamu Suwata, Sakata (JP); Hiroshi Yokoyama, Sakata (JP); Shinichi Yamagata, Sakata (JP); Yugaku Abe, Sakata (JP)

(73) Assignees: Sumitomo Electric Industries, Ltd., Osaka (JP); A.L.M.T. Corp., Tokyo (JP)

( * ) Notice: Subject to any disclaimer, the term of this patent is extended or adjusted under 35 U.S.C. 154(b) by 227 days.

This patent is subject to a terminal disclaimer.

(21) Appl. No.: 13/580,082

(22) PCT Filed: Dec. 27, 2010

(86) PCT No.: PCT/JP2010/073556
§ 371 (c)(1),
(2), (4) Date: Aug. 20, 2012

(87) PCT Pub. No.: WO2011/102059
PCT Pub. Date: Aug. 25, 2011

(65) Prior Publication Data
US 2012/0315502 A1    Dec. 13, 2012

(30) Foreign Application Priority Data
Feb. 19, 2010    (JP) ................. 2010-034782

(51) Int. Cl.
*B32B 15/01*    (2006.01)
*C25D 3/66*    (2006.01)
(Continued)

(52) U.S. Cl.
CPC ............ *H01L 23/3735* (2013.01); *B32B 15/01* (2013.01); *C22C 9/00* (2013.01);
(Continued)

(58) Field of Classification Search
None
See application file for complete search history.

(56) References Cited

U.S. PATENT DOCUMENTS

| 4,025,997 A | 5/1977 | Gernitis et al. |
|---|---|---|
| 4,371,589 A | 2/1983 | Warner et al. |

(Continued)

FOREIGN PATENT DOCUMENTS

| CN | 1838904 A | 9/2006 |
|---|---|---|
| CN | 101142080 A | 3/2008 |

(Continued)

OTHER PUBLICATIONS

Chinese Office Action for corresponding Chinese Application No. 201080064177.8, dated Apr. 1, 2014, 16 pages.
(Continued)

*Primary Examiner* — John J Zimmerman
(74) *Attorney, Agent, or Firm* — Ditthavong & Steiner, P.C.

(57) ABSTRACT

There is provided a metal laminated structure in which a first metal layer containing tungsten is provided on a first surface of a second metal layer containing copper and a third metal layer containing tungsten is provided on a second surface of the second metal layer opposite to the first surface, and the first metal layer contains crystal grains of tungsten in a form of a columnar crystal extending in a direction perpendicular to the first surface of the second metal layer and the third metal layer contains crystal grains of tungsten in a form of a columnar crystal extending in a direction perpendicular to the second surface of the second metal layer, and a method for producing the metal laminated structure.

8 Claims, 9 Drawing Sheets

(51) Int. Cl.
*H01L 23/373* (2006.01)
*C22C 9/00* (2006.01)
*C22C 27/00* (2006.01)
*C25D 5/10* (2006.01)
*C25D 5/12* (2006.01)
*H01L 33/64* (2010.01)
*C25D 3/12* (2006.01)
*C25D 3/38* (2006.01)

(52) U.S. Cl.
CPC ............... *C22C 27/00* (2013.01); *C25D 3/66* (2013.01); *C25D 5/10* (2013.01); *C25D 5/12* (2013.01); *H01L 33/641* (2013.01); *C25D 3/12* (2013.01); *C25D 3/38* (2013.01); *H01L 2924/0002* (2013.01)
USPC ............ 428/665; 428/635; 428/675; 427/431

(56) References Cited

U.S. PATENT DOCUMENTS

| | | | |
|---|---|---|---|
| 4,448,854 A * | 5/1984 | Schuller et al. | 428/611 |
| 5,445,106 A * | 8/1995 | Einset | 117/1 |
| 5,525,815 A * | 6/1996 | Einset | 257/77 |
| 6,352,014 B1 | 3/2002 | Goland et al. | |
| 7,593,681 B2 * | 9/2009 | Tamemasa et al. | 399/333 |
| 2002/0140336 A1 | 10/2002 | Stoner et al. | |
| 2004/0140474 A1 | 7/2004 | Ueda et al. | |
| 2006/0202211 A1 | 9/2006 | Ueda et al. | |
| 2007/0102070 A1 | 5/2007 | Tuma et al. | |
| 2007/0231963 A1 | 10/2007 | Doan et al. | |
| 2008/0105553 A1 | 5/2008 | Nitta et al. | |
| 2008/0298024 A1 * | 12/2008 | Takashima et al. | 361/718 |
| 2009/0045431 A1 | 2/2009 | Ueda et al. | |
| 2009/0258248 A1 | 10/2009 | Tsushima | |
| 2010/0059271 A1 | 3/2010 | Yoneda et al. | |
| 2010/0243456 A1 * | 9/2010 | Nitta et al. | 205/50 |
| 2012/0100392 A1 * | 4/2012 | Nitta et al. | 428/663 |
| 2012/0164468 A1 | 6/2012 | Kawamura | |

FOREIGN PATENT DOCUMENTS

| | | |
|---|---|---|
| CN | 101291769 A | 10/2008 |
| CN | 101496165 A | 7/2009 |
| EP | 2 056 344 A1 | 5/2009 |
| JP | 1305544 A | 12/1989 |
| JP | 2080589 A | 3/1990 |
| JP | 2080589 A | 3/1990 |
| JP | 02-256262 A | 10/1990 |
| JP | 3218054 A | 9/1991 |
| JP | 4230063 A | 8/1992 |
| JP | 6268115 A | 9/1994 |
| JP | H07-211822 A | 8/1995 |
| JP | H08-222658 A | 8/1996 |
| JP | H10-012767 A | 1/1998 |
| JP | H10-012767 A | 10/1998 |
| JP | 11284111 A | 10/1999 |
| JP | 2000124370 A | 4/2000 |
| JP | 2000-323632 A | 11/2000 |
| JP | 2003-037204 A | 2/2003 |
| JP | 2004-088083 A | 3/2004 |
| JP | 2004249589 A | 9/2004 |
| JP | 2005097704 A | 4/2005 |
| JP | 2005105354 A | 4/2005 |
| JP | 2006100640 A | 4/2006 |
| JP | 2006127847 A | 5/2006 |
| JP | 2006299338 A | 11/2006 |
| JP | 3862737 B1 | 12/2006 |
| JP | 2007115731 A | 5/2007 |
| JP | 2007227458 A | 9/2007 |
| JP | 2007327081 A | 12/2007 |
| JP | 2008214728 A | 9/2008 |
| JP | 2009235462 A | 10/2009 |
| JP | 2010-529680 A | 8/2010 |
| JP | 2011149103 A | 8/2011 |
| TW | 200636934 B | 5/2006 |
| TW | 200733863 A | 9/2007 |
| WO | 2005018393 A1 | 3/2005 |
| WO | WO 2006/038476 A1 | 4/2006 |
| WO | 2007046164 A1 | 4/2007 |
| WO | 2008013279 A1 | 1/2008 |
| WO | WO 2008/013279 A1 | 1/2008 |
| WO | WO 2011/001795 A1 | 1/2011 |

OTHER PUBLICATIONS

Notice of Grounds of Rejection for corresponding Japanese Application No. 2010-034782, dated Apr. 1, 2014, 5 pages.
International Search Report for PCT Application No. PCT/JP2010/073556 dated Apr. 5, 2011, pp. 1-4.
International Search Report for Application No. PCT/JP2010/059695; mail date: Sep. 21, 2010.
JP Office Action dated Feb. 8, 2011 for JP Patent Application No. 155159/2009, 5 pages.
Nakajima et al., "Electrodeposition of Metallic Tungsten . . . ", Electrochemical and Solid-State Letters, 2005, vol. 8, C91-C94, 4 pages.
Notice of Grounds of Rejection for Japanese Patent Application No. 2010-185166 dated Jan. 29, 2013, pp. 1-6.
English Machine Translation of JP 2004-249589, translated Mar. 20, 2013, 10 pages.
Notice of Grounds of Rejection in Japanese Patent Application No. 2008-333369, mailed on Jan. 8, 2013, 9 pages.
Office Action for related Japanese Patent Application No. 2008-333369 dated Jun. 4, 2013, 6 pages.
Office Action for corresponding JP Application No. 2011-085441, issued Aug. 27, 2013, 7 pages.
Koyama, K. "Molten Salt Electrolysis of Vanadium, Molybdenum and Tungsten", Molten Salts, Molten Salt Committee of the Electrochemical Society of Japan, Feb. 2, 2000. vol. 43 No. 1, pp. 38-63 (English language contained therein).
Notification of the First Office Action of corresponding Chinese Application No. 201080029791.0, dated Nov. 20, 2013, 15 pages.
Office Action for corresponding Taiwanese Application No. 100105393, dated Jan. 29, 2015, 9 pages.

* cited by examiner

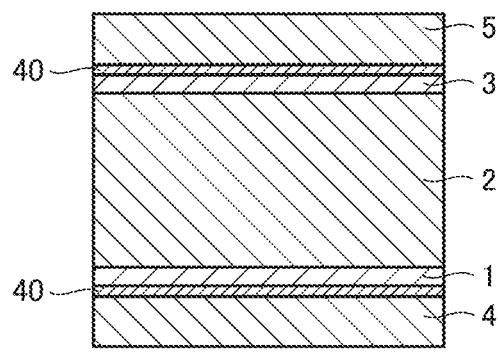
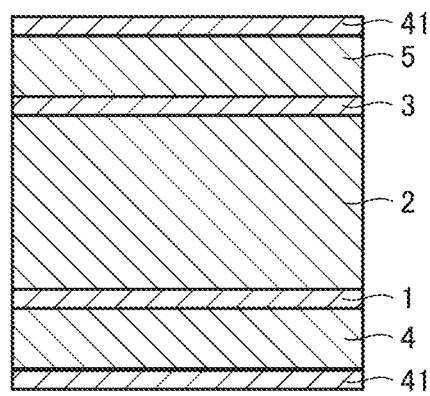

METAL LAMINATED STRUCTURE AND METHOD FOR PRODUCING THE SAME

TECHNICAL FIELD

The present invention relates to a metal laminated structure and a method for producing the same.

BACKGROUND ART

Light Emitting Diode (LED) device and similar semiconductor devices are typically provided with a radiation substrate (a heat sink) for externally radiating heat generated when the device has a semiconductor element driven.

For example, Japanese Patent No. 3862737 (Patent Literature 1) describes that a layer of a first material having high thermal conductivity such as copper (Cu) and a layer of a second material having a small coefficient of thermal expansion such as molybdenum (Mo) and tungsten (W) undergo uni-axial hot pressing (hot pressing) with pressure of not less than 50 kgf/cm$^2$ and not more than 150 kgf/cm$^2$ applied thereto and at a temperature of not lower than 850° C. and not higher than 1000° C. and are thus bonded together to produce a clad material to be used as a radiation substrate for a semiconductor device (see Patent Literature 1, paragraphs [0011], [0015], [0016], [0033], [0034] and the like for example).

CITATION LIST

Patent Literature

[Patent Literature 1] Japanese Patent No. 3862737

SUMMARY OF INVENTION

Technical Problem

However, in the radiation substrate formed of the clad material produced by hot pressing as described in Patent Literature 1, since crystal grains of the second material, such as Mo and W, extended in a horizontal direction (a direction parallel to a surface of the radiation substrate), there was a problem that horizontal thermal expansion of the radiation substrate increased.

Furthermore, in the radiation substrate formed of the clad material produced by hot pressing, due to the difference in deformation between the first material such as Cu and the second material such as Mo and W, voids (defects) are formed in the second material. Accordingly, there was a problem that thermal conduction in a perpendicular direction (a direction parallel to a surface of the radiation substrate) was obstructed.

In view of the above-mentioned circumstances, the object of the present invention is to provide a metal laminated structure and a method for producing the same that can reduce thermal expansion in a horizontal direction and achieve excellent thermal conduction in a perpendicular direction.

Solution to Problem

The present invention provides a metal laminated structure including a first metal layer containing tungsten, a second metal layer containing copper, and a third metal layer containing tungsten, the first metal layer being provided on a first surface of the second metal layer, the third metal layer being provided on a second surface of the second metal layer opposite to the first surface, the first metal layer containing crystal grains of tungsten in a form of a columnar crystal extending in a direction perpendicular to the first surface of the second metal layer, the third metal layer containing crystal grains of tungsten in a form of a columnar crystal extending in a direction perpendicular to the second surface of the second metal layer.

Furthermore, in the metal laminated structure of the present invention, preferably, the first metal layer and the third metal layer are not less than 1 µm and not more than 200 µm in thickness.

Furthermore, in the metal laminated structure of the present invention, preferably, the number of voids of not less than 1 µm is not more than 2 in an area having a length of 500 µm in a longitudinal cross section of the metal laminated structure.

Furthermore, in the metal laminated structure of the present invention, preferably, the metal laminated structure includes an odd number of layers not less than 3 layers.

Furthermore, the metal laminated structure of the present invention preferably includes a metal layer containing at least one type selected from the group consisting of cobalt, nickel, chromium, and gold.

Furthermore, in the metal laminated structure of the present invention, preferably, an outermost surface of the metal laminated structure includes a metal layer containing copper.

Furthermore, in the metal laminated structure of the present invention, preferably, an outermost surface of the metal laminated structure includes a metal layer containing nickel and a metal layer containing copper is provided at an inner side of the metal layer containing nickel.

Moreover, the present invention provides a method for producing a metal laminated structure including the steps of depositing a first metal layer containing tungsten on a first surface of a second metal layer containing copper by molten salt bath plating and depositing a third metal layer containing tungsten on a second surface of the second metal layer opposite to the first surface by molten salt bath plating.

Advantageous Effects of Invention

The present invention can thus provide a metal laminated structure and a method for producing the same that can reduce thermal expansion in a horizontal direction and achieve excellent thermal conduction in a perpendicular direction.

BRIEF DESCRIPTION OF DRAWINGS

FIG. 14 is a schematic cross section of a metal laminated structure of a third embodiment.

FIG. 15 is a schematic cross section of a metal laminated structure of a fourth embodiment.

DESCRIPTION OF EMBODIMENTS

Hereinafter, the present invention will be described in embodiments. In the figures, identical or corresponding components are identically denoted.

First Embodiment

Figure 1:
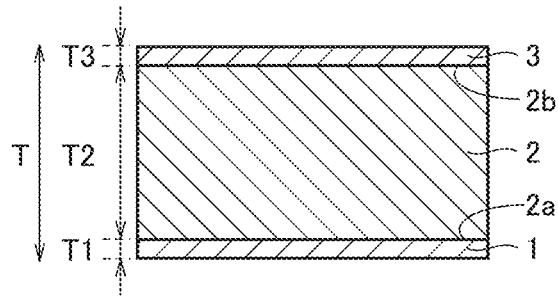
FIG. 1 is a schematic cross section of a metal laminated structure of a first embodiment.

FIG. 1 is a schematic cross section of an example of a metal laminated structure of the present invention in a first embodiment. Herein, the metal laminated structure is a laminated structure having a 3-layer structure formed of a first metal layer 1 containing tungsten, a second metal layer 2 containing copper, a third metal layer 3 containing tungsten.

Herein, first metal layer 1 is provided on a first surface 2a, which is one surface of second metal layer 2, and third metal layer 3 is provided on a second surface 2b, which is a surface of second metal layer 2 that is opposite to first surface 2a.

Preferably, a thickness T1 of first metal layer 1 and a thickness T3 of third metal layer 3 are each not less than 1 μm and not more than 200 μm. In the case where thickness T1 of first metal layer 1 and thickness T3 of third metal layer 3 are each not less than 1 μm and not more than 200 μm, there is a tendency that a structure of a columnar crystal is obtained without being affected by a crystalline structure of second metal layer 2 and that a dense structure having no voids inside the layer is obtained.

Preferably, a thickness T2 of second metal layer 2 is not less than 10 μm and not more than 1500 μm. In the case where thickness T2 of second metal layer 2 is not less than 10 μm and not more than 1500 μm, there is a tendency that deformation when forming first metal layer 1 and third metal layer 3 can be reduced and that a total thickness of the metal laminated structure can be set in a preferable range described hereinafter.

Preferably, the total thickness of the metal laminated structure is not less than 20 μm and not more than 3000 μm. In the case where the total thickness of the metal laminated structure is not less than 20 μm and not more than 3000 μm, there is a tendency that the metal laminated structure is excellent in handleability as a product for its proper strength and that the metal laminated structure is excellent in workability when it is necessary to bond another material thereon and cut it, such as for a heat sink.

Furthermore, when the metal laminated structure has first metal layer 1 having thickness T1, second metal layer 2 having thickness T2, and third metal layer 3 having thickness T3, then, a ratio of (T1+T3) relative to (T1+T2+T3), i.e., (T1+T3)/(T1+T2+T3), is preferably a ratio of not less than 0.016 and not more than 0.89. The ratio of not less than 0.016 and not more than 0.89 allows the metal laminated structure to have an appropriate coefficient of thermal expansion in the horizontal direction and also achieve appropriate thermal conductivity in the perpendicular direction for example in an application used in combination with a different type of material such as a heat sink.

Furthermore, in order to minimize warpage of the metal laminated structure, it is preferable that the metal laminated structure, as seen at a center thereof as seen depthwise (in this example, a portion at ½ of total thickness T of the metal laminated structure), has an upper portion and a lower portion symmetrically with respect to the depthwise center. Note that being symmetrical means not only an idea that the metal laminated structure as seen at the depthwise center vertically upward toward its upper end has layers completely identical in material and equal in thickness to those of the metal laminated structure as seen at the depthwise center vertically downward toward its lower end, but also an idea that the former has layers equivalent in material and thickness to those of the latter.

Figure 2:
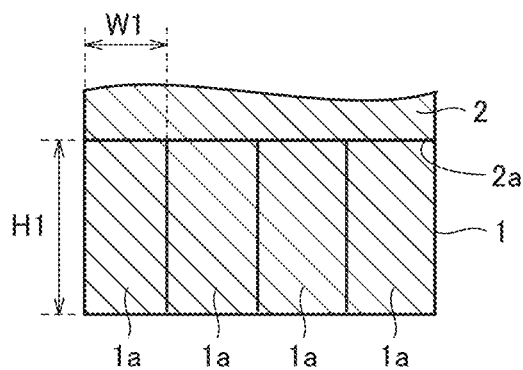
FIG. 2 is a schematic enlarged cross section of one example of a first metal layer of the metal laminated structure of the first embodiment.

FIG. 2 is a schematic enlarged cross section of one example of first metal layer 1 of the metal laminated structure of the first embodiment. FIG. 2 shows a longitudinal cross section (a cross section in a direction perpendicular to first surface 2a of second metal layer 2) of the metal laminated structure, and first metal layer 1 includes a plurality of crystal grains 1a of tungsten which are each a columnar crystal extending in the direction perpendicular to first surface 2a of second metal layer 2. To allow crystal grain 1a of tungsten to be "a columnar crystal extending in the direction perpendicular to first surface 2a", it is necessary that an aspect ratio (H1/W1), which is a ratio of a length H1 of crystal grain 1a of tungsten in a direction having a gradient of 90° relative to first surface 2a and a length W1 of crystal grain 1a of tungsten in a direction having a gradient of 0° relative to first surface 2a, is larger than 1. Such an extending direction of crystal grain 1a of tungsten is for example within a range of 90°±30° relative to first surface 2a of second metal layer 2.

Figure 3:
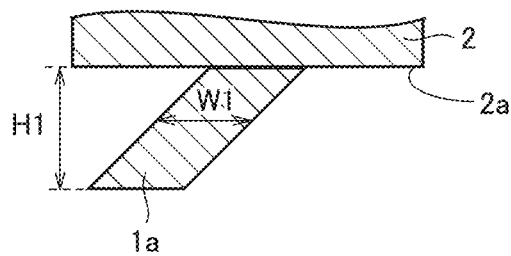
FIG. 3 is a schematic enlarged cross section of another example of the first metal layer of the metal laminated structure of the first embodiment.

FIG. 3 is a schematic enlarged cross section of another example of first metal layer 1 of the metal laminated structure of the first embodiment. FIG. 3 shows a longitudinal cross section (a cross section in the direction perpendicular to first surface 2a of second metal layer 2) of the metal laminated structure, and, as shown in FIG. 3, even if crystal grain 1a of tungsten configuring first metal layer 1 inclines relative to first surface 2a of second metal layer 2, lengths H1 and W1 of crystal grain 1a of tungsten are, respectively, a length in a direction having a gradient of 90° relative to first surface 2a and a length in a direction having a gradient of 0° relative to first surface 2a.

Furthermore, the total number of crystal grains 1a of tungsten having the aspect ratio (H1/W1) larger than 1 occupies preferably not less than 50%, more preferably not less than 70% of the total number of the crystal grains of tungsten configuring any longitudinal cross section of first metal layer 1. When the total number of crystal grains 1a of tungsten having the aspect ratio (H1/W1) larger than 1 occupies for not less than 50%, not less than 70% in particular, of the total number of the crystal grains of tungsten configuring any longitudinal cross section of first metal layer 1, there is a tendency that thermal expansion in a horizontal direction of the metal laminated structure can be reduced more significantly.

Figure 4:
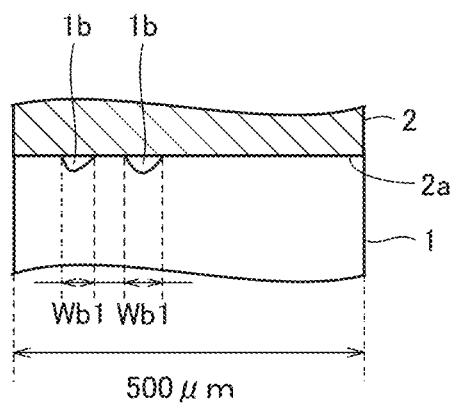
FIG. 4 is a schematic enlarged cross section of still another example of the first metal layer of the metal laminated structure of the first embodiment.

FIG. 4 is a schematic enlarged cross section of another example of first metal layer 1 of the metal laminated structure of the first embodiment. FIG. 4 shows an area having a length of 500 μm in any longitudinal cross section (a cross section in the direction perpendicular to first surface 2a of second metal layer 2) of the metal laminated structure, and void 1b that is a recessed defect is formed in a surface of first metal layer 1 at a side of first surface 2a of second metal layer 2. Since void 1b obstructs thermal conduction in a perpendicular direction of the metal laminated structure, the number of voids 1b the opening of which has a width Wb1 of 1 μm in any longitudinal cross section is preferably not more than 2, more preferably not more than 1, and most preferably 0. In the case where the number of such voids 1b is not more than 2, not more than 1, or 0, there is a tendency that thermal conduction in the perpendicular direction of the metal laminated structure can be more excellent.

Figure 5:
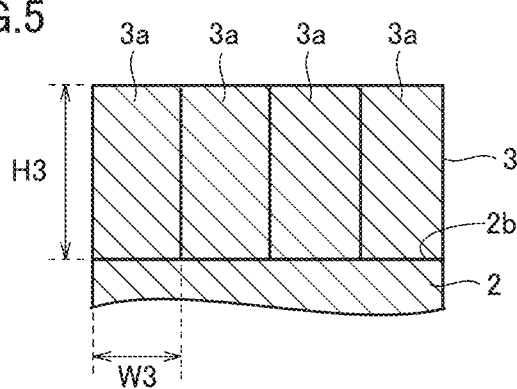
FIG. 5 is a schematic enlarged cross section of one example of a third metal layer of the metal laminated structure of the first embodiment.

FIG. 5 is a schematic enlarged cross section of one example of third metal layer 3 of the metal laminated structure of the first embodiment. FIG. 5 shows a longitudinal cross section (a cross section in a direction perpendicular to second surface 2b of second metal layer 2) of the metal laminated structure, and third metal layer 3 includes a plurality of crystal grains 3a of tungsten which are each a columnar crystal extending in the direction perpendicular to second surface 2b of second metal layer 2. Note that to allow crystal grain 3a of tungsten to be "a columnar crystal extending in the direction perpendicular to second surface 2b", it is necessary that an aspect ratio (H3/W3), which is a ratio of a length H3 of crystal grain 3a of tungsten in a direction having a gradient of 90° relative to second surface 2b and a length W3 of crystal grain 3a of tungsten in a direction having a gradient of 0° relative to second surface 2b, is larger than 1. Such an extending direction of crystal grain 3a of tungsten is for example within a range of 90°±30° relative to second surface 2b of second metal layer 2.

Figure 6:
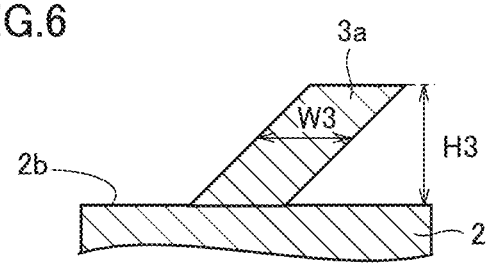
FIG. 6 is a schematic enlarged cross section of another example of the third metal layer of the metal laminated structure of the first embodiment.

FIG. 6 is a schematic enlarged cross section of another example of third metal layer 3 of the metal laminated structure of the first embodiment. As shown in FIG. 6, even if crystal grain 3a of tungsten configuring third metal layer 3 inclines relative to second surface 2b of second metal layer 2, lengths H3 and W3 of crystal grain 3a of tungsten are, respectively, a length in a direction having a gradient of 90° relative to second surface 2b and a length in a direction having a gradient of 0° relative to second surface 2b.

Furthermore, the total number of crystal grains 3a of tungsten having the aspect ratio (H3/W3) larger than 1 occupies preferably not less than 50%, more preferably not less than 70% of the total number of the crystal grains of tungsten configuring any longitudinal cross section of third metal layer 3. When the total number of crystal grains 3a of tungsten having the aspect ratio (H3/W3) larger than 1 occupies not less than 50%, not less than 70% in particular, of the total number of the crystal grains of tungsten configuring any longitudinal cross section of third metal layer 3, there is a tendency that thermal expansion in a horizontal direction of the metal laminated structure can be reduced more significantly.

Figure 7:
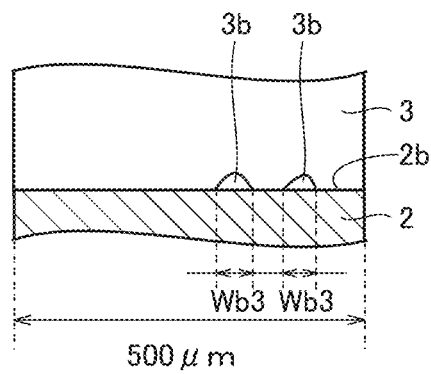
FIG. 7 is a schematic enlarged cross section of still another example of the third metal layer of the metal laminated structure of the first embodiment.

FIG. 7 is a schematic enlarged cross section of another example of third metal layer 3 of the metal laminated structure of the first embodiment. FIG. 7 shows an area having a length of 500 μm in any longitudinal cross section (a cross section in the direction perpendicular to second surface 2b of second metal layer 2) of the metal laminated structure, and void 3b that is a recessed defect is formed in a surface of third metal layer 3 at a side of second surface 2b of second metal layer 2. Since void 3b obstructs thermal conduction in the perpendicular direction of the metal laminated structure, the number of voids 3b the opening of which has a width Wb3 of 1 μm in any longitudinal cross section is preferably not more than 2, more preferably not more than 1, and most preferably 0. In the case where the number of such voids 3b is not more than 2, not more than 1, or 0, there is a tendency that thermal conduction in the perpendicular direction of the metal laminated structure can be more excellent.

Hereinafter will be described an example of a method for producing the metal laminated structure of the first embodiment.

Figure 8:
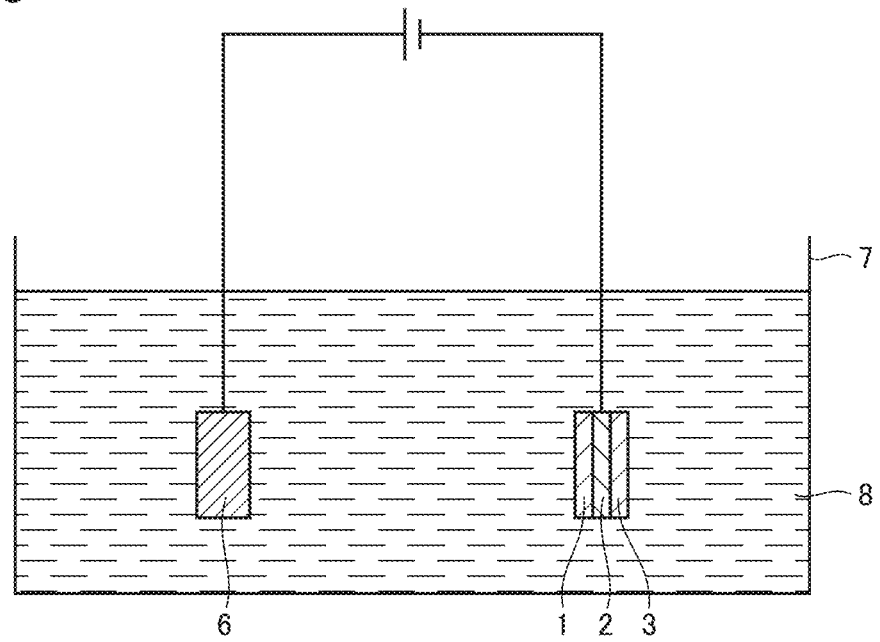
FIG. 8 schematically shows a configuration for illustrating an example of a method for producing the metal laminated structure of the first embodiment.

Initially, as shown in the schematic configuration of FIG. 8, a molten salt bath 8 containing tungsten is accommodated in a container 7. Molten salt bath 8 is not specially limited if electrolysis of molten salt bath 8 can deposit tungsten. For example, as molten salt bath 8, a molten salt bath or the like prepared by melting a mixture of potassium fluoride (KF), boron oxide ($B_2O_3$), and tungsten oxide ($WO_3$) mixed at a molar ratio for example of 67:26:7 can be used.

Subsequently, for example, second metal layer 2 of copper foil or the like and a counter electrode 6 are immersed in molten salt bath 8 accommodated in container 7. Herein, as counter electrode 6, an electrode formed of tungsten that can maintain the ion balance of the bath by its dissolution can be used.

Subsequently, with second metal layer 2 serving as a negative electrode and counter electrode 6 serving as a positive electrode, a voltage is applied between second metal layer 2 and counter electrode 6 to electrolyze molten salt bath 8. By such molten salt bath plating, the tungsten in molten salt bath 8 is deposited on the opposite surfaces of second metal layer 2 to form first metal layer 1 containing tungsten and third metal layer 3 containing tungsten.

Then, second metal layer 2 after first metal layer 1 and third metal layer 3 are formed is extracted from molten salt bath 8, and ion exchanged water or the like is used to wash away molten salt bath 8 on first metal layer 1 and third metal layer 3. Then for example a predetermined acid is used for cleaning to remove oxide film formed on a surface of each of first metal layer 1 and third metal layer 3. The metal laminated structure of the first embodiment can thus be produced.

Hereinafter will be described another example of the method for producing the metal laminated structure of the first embodiment.

Figure 9:
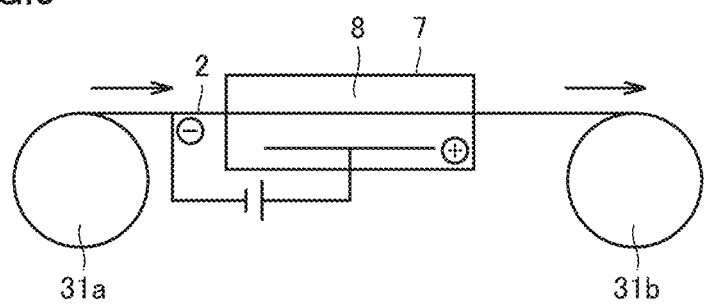
FIG. 9 schematically shows a configuration for illustrating another example of the method for producing the metal laminated structure of the first embodiment.

Initially, as shown in the schematic configuration of FIG. 9, second metal layer 2 of a copper foil or the like is bridged between a first roll 31a and a second roll 31b to pass through molten salt bath 8 accommodated in container 7.

Then, second metal layer 2 is unrolled from first roll 31a and continuously immersed in molten salt bath 8 accommodated in container 7, while molten salt bath 8 is electrolyzed.

Such molten salt bath plating allows tungsten to be deposited on the opposite surfaces of second metal layer 2 to form first metal layer 1 containing tungsten and third metal layer 3 containing tungsten. The metal laminated structure of the first embodiment can thus be produced.

Thereafter, the metal laminated structure of the first embodiment having first metal layer 1 and third metal layer 3 formed by depositing tungsten on the opposite surfaces of second metal layer 2 is wound up on second roll 31b and thus collected.

As shown in FIG. 9, moving second metal layer 2 and therewhile subjecting second metal layer 2 to molten salt plating to deposit tungsten on the opposite surfaces of second metal layer 2 to form an elongate metal laminated structure allows the metal laminated structure to be produced efficiently.

The metal laminated structure of the first embodiment is produced by molten salt plating as described above, rather than conventional hot pressing, to have second metal layer 2 containing copper that has opposite surfaces with first and third metal layers 1 and 3, respectively, thereon containing tungsten. First metal layer 1 and third metal layer 3 formed by such molten salt plating have a tendency that they are configured of crystal grains 1a and 3a, respectively, of tungsten in the form of columnar crystals extending in directions perpendicular to first surface 2a and second surface 2b, respectively, of second metal layer 2.

Therefore, in the metal laminated structure of the first embodiment, there is a tendency that crystal grains 1a and 3a of tungsten configuring first metal layer 1 and third metal layer 3 are extending in the directions perpendicular to first surface 2a and second surface 2b, respectively, of second metal layer 2 in contrast to a radiation substrate formed of a clad material produced by conventional hot pressing. Accordingly, it can reduce thermal expansion in a direction parallel to first surface 2a and second surface 2b of second metal layer 2 (or in a horizontal direction).

Furthermore, when molten salt plating as described above is employed to form first metal layer 1 and third metal layer 3 containing tungsten each on the opposite surfaces of second metal layer 2 containing copper, those surfaces of first metal layer 1 and third metal layer 3 configuring interfaces with second metal layer 2 have less voids 1b and 3b. Accordingly, thermal conduction in the direction perpendicular to first surface 2a and second surface 2b of second metal layer 2 can be excellent.

The metal laminated structure of the first embodiment produced as described above can be used for example as a radiation substrate (a heat sink) for a semiconductor device.

Figure 10:
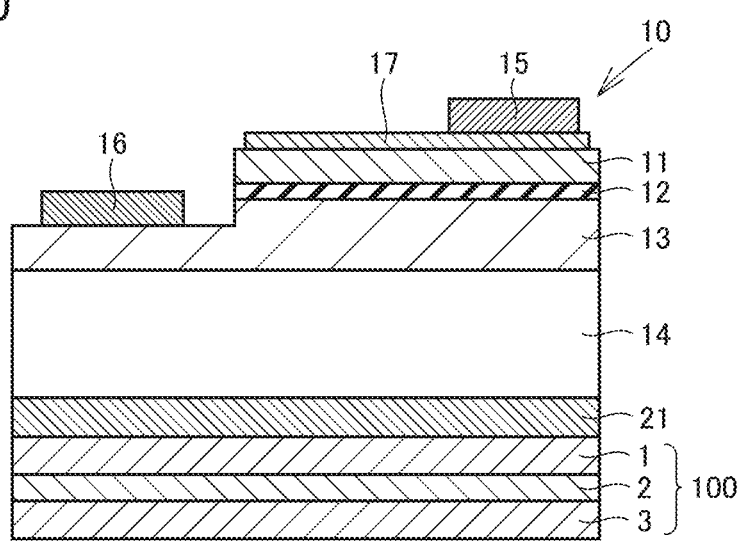
FIG. 10 is a schematic cross section of an example of an LED device that is an example of a semiconductor device using the metal laminated structure of the first embodiment as a radiation substrate.

FIG. 10 is a schematic cross section of an example of an LED device that is an example of a semiconductor device using the metal laminated structure of the first embodiment as a radiation substrate. Herein, the LED device shown in FIG. 10 includes a metal laminated structure 100 of the first embodiment and an LED structure 10 provided on metal laminated structure 100, and metal laminated structure 100 and LED structure 10 are joined together by a joining layer 21.

Herein, LED structure 10 includes a semiconductor substrate 14, an n-type semiconductor layer 13 disposed on semiconductor substrate 14, an active layer 12 disposed on n-type semiconductor layer 13, a p-type semiconductor layer 11 disposed on active layer 12, a semi-transparent electrode 17 disposed on p-type semiconductor layer 11, a p electrode 15 disposed on semi-transparent electrode 17, and an n electrode 16 disposed on n-type semiconductor layer 13.

Note that LED structure 10 may be any structure that includes p-type semiconductor layer 11, n-type semiconductor layer 13 and active layer 12 with active layer 12 posed between p-type semiconductor layer 11 and n-type semiconductor layer 13 and allows a current injected thereto to cause active layer 12 to emit light, and it can for example be a conventionally known LED structure.

LED structure 10 preferably has p-type semiconductor layer 11, active layer 12, and n-type semiconductor layer 13 each formed with a compound of a group III element (at least one element selected from the group consisting of Al, In and Ga) and a group V element (nitrogen), or a group III-V nitride semiconductor, in particular. This allows active layer 12 to emit blue light.

As one example of LED structure 10 that allows active layer 12 to emit blue light, for example, an LED structure or the like can be exemplified. As shown in FIG. 10, the LED structure has a GaN substrate or a sapphire substrate as semiconductor substrate 14, a p-type GaN layer as p-type semiconductor layer 11, an undoped InGaN layer as active layer 12, and an n-type GaN layer as n-type semiconductor layer 13.

Furthermore, the metal laminated structure of the first embodiment is not limited to an LED device, and is also applicable to a radiation substrate for a semiconductor device other than the LED device, such as a semiconductor laser device or a field effect transistor. Herein, as semiconductor substrate 14 used in a semiconductor device other than LED structure 10 allowing active layer 12 to emit blue light, for example, a silicon substrate, a silicon carbide substrate, a gallium arsenide substrate or the like can be used.

It is needless to say that p-type semiconductor layer 11 is a semiconductor layer having the p-type conduction type doped with p-type impurity and n-type semiconductor layer 13 is a semiconductor layer having the n-type conduction type doped with n-type impurity. Furthermore, active layer 12 may be of any one of the p-type conduction type and n-type conduction type and may be a semiconductor layer undoped with any of p-type impurity or n-type impurity.

Furthermore, another layer may be included at at least one of locations: between semiconductor substrate 14 and n-type semiconductor layer 13; between n-type semiconductor layer 13 and active layer 12; between active layer 12 and p-type semiconductor layer 11; between p-type semiconductor layer 11 and semi-transparent electrode 17; between semi-transparent electrode 17 and p electrode 15; and between n-type semiconductor layer 13 and n electrode 16.

Furthermore, as joining layer 21, for example, a layer formed of an electrically conductive substance higher in thermal conductivity than eutectic solder can be used. As joining layer 21, in particular, a metal having low electric resistance and high thermal conductivity and being less oxidizable can be preferably used, and inter alia, a layer containing at least one selected from the group consisting of gold, silver, copper, and nickel can be more preferably used.

The LED device thus configured has n electrode 16 as a negative electrode and p electrode 15 as a positive electrode and voltage is applied therebetween to flow a current through LED structure 10 from p electrode 15 to n electrode 16. LED structure 10 thus allows active layer 12 between p-type semiconductor layer 11 and n-type semiconductor layer 13 to generate light.

Note that the LED device of the configuration shown in FIG. 10 can be produced for example as follows:

Initially, semiconductor substrate 14 is set for example in metal organic chemical vapor deposition (MOCVD) equipment, and thereafter, on a surface of semiconductor substrate 14, n-type semiconductor layer 13, then active layer 12, and then p-type semiconductor layer 11 are successively, epitaxially grown for example by MOCVD or the like.

Then, n-type semiconductor layer 13, active layer 12, and p-type semiconductor layer 11 are partially removed, for example by photo-etching, and then, for example, lift off is employed to form semi-transparent electrode 17 and p electrode 15 on p-type semiconductor layer 11 and form n electrode 16 on n-type semiconductor layer 13.

After p electrode 15 and n electrode 16 are formed, metal laminated structure 100 of the first embodiment is joined by joining layer 21 to a back surface of semiconductor substrate 14.

Then, by for example a round rotary blade or the like, semiconductor substrate 14 after joining layer 21 is formed is cut to be divided into individual LED devices having a schematic cross section shown in FIG. 10. Thus, the LED device configured as shown in FIG. 10 can be obtained.

As mentioned above, metal laminated structure 100 of the first embodiment can reduce thermal expansion in a horizontal direction and achieve excellent thermal conduction in a perpendicular direction. Accordingly, when metal laminated structure 100 of the first embodiment is used as a radiation substrate for a semiconductor device such as an LED device, the deformation of the semiconductor device caused by heat generation can be reduced and the generated heat can be also externally dissipated efficiently.

Second Embodiment

Figure 11:
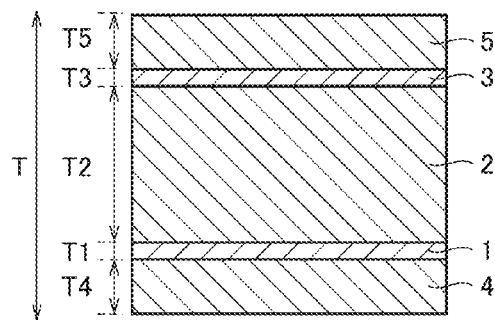
FIG. 11 is a schematic cross section of a metal laminated structure of a second embodiment.

FIG. 11 is a schematic cross section of another example of the metal laminated structure of the present invention in a second embodiment. Herein, the metal laminated structure of the second embodiment is characterized by having a 5-layer structure in which a fourth metal layer 4 containing copper is provided on the surface of first metal layer 1 of the first embodiment at the opposite side of second metal layer 2 and a fifth metal layer 5 containing copper is provided on the surface of third metal layer 3 of the first embodiment at the opposite side of third metal layer 3.

Preferably, a thickness T4 of fourth metal layer 4 and a thickness T5 of fifth metal layer 5 are each not less than 10 μm and not more than 500 μm. In the case where thickness T4 of fourth metal layer 4 and thickness T5 of fifth metal layer 5 are each not less than 10 μm and not more than 500 μm, there is a tendency that surface roughness can be reduced and that the metal laminated structure is excellent in handleability as a product for its proper strength and that the metal laminated structure is excellent in workability when it is necessary to bond another material thereon and cut it, such as for a heat sink.

Furthermore, when the metal laminated structure has first metal layer 1 having thickness T1, second metal layer 2 having thickness T2, third metal layer 3 having thickness T3, fourth metal layer 4 having thickness T4, and fifth metal layer 5 having thickness T5, then, a ratio of (T1+T3) relative to (T1+T2+T3+T4+T5), i.e., (T1+T3)/(T1+T2+T3+T4+T5), is preferably a ratio of not less than 0.015 and not more than 0.89. The ratio of not less than 0.015 and not more than 0.89 allows the metal laminated structure to have an appropriate coefficient of thermal expansion in the horizontal direction and also achieve appropriate thermal conductivity in the perpendicular direction for example in an application used in combination with a different type of material such as a heat sink.

Hereinafter will be described an example of the method for producing the metal laminated structure of the second embodiment.

Initially, similarly as has been described in the first embodiment, as shown in FIG. 8, molten salt bath 8 containing tungsten is prepared in container 7, and the tungsten in molten salt bath 8 is deposited on the opposite surfaces of second metal layer 2, such as copper foil. By such molten salt bath plating, first metal layer 1 containing tungsten and third metal layer 3 containing tungsten are deposited on the opposite surfaces of second metal layer 2, respectively.

Then, second metal layer 2 after first metal layer 1 and third metal layer 3 are formed is extracted from molten salt bath 8, and ion exchanged water or the like is used to wash away molten salt bath 8 on first metal layer 1 and third metal layer 3. Then for example a predetermined acid is used for cleaning to remove oxide film formed on a surface of each of first metal layer 1 and third metal layer 3.

Figure 12:
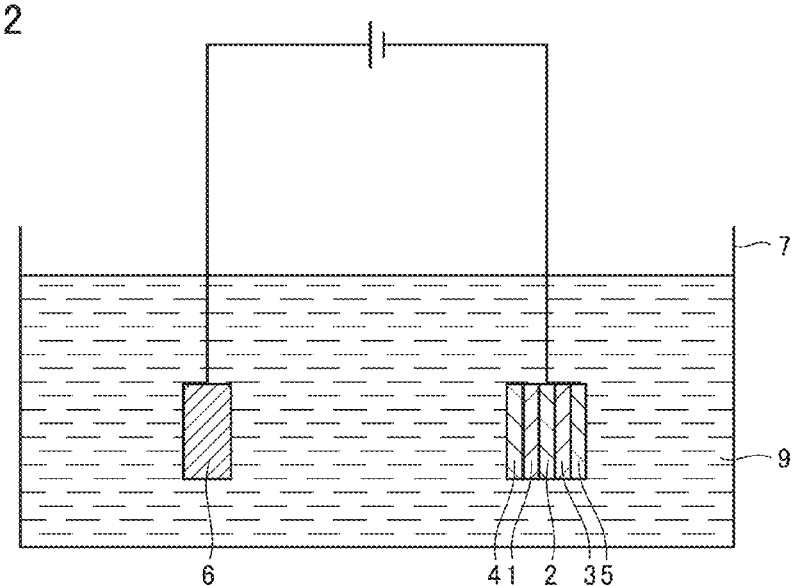
FIG. 12 schematically shows a configuration for illustrating an example of the method for producing the metal laminated structure of the second embodiment.

Then, as shown in the schematic configuration of FIG. 12, second metal layer 2 after first metal layer 1 and third metal layer 3 are formed, and counter electrode 6 are immersed in an electroplating solution 9 accommodated in container 7.

Herein, electroplating solution 9 can be any electroplating solution that contains copper, and it can for example be a commercially available plating solution of copper sulfate.

Subsequently, with second metal layer 2 serving as a negative electrode and counter electrode 6 serving as a positive electrode, a voltage is applied between second metal layer 2 and counter electrode 6 to electrolyze electroplating solution 9. Thus, the copper in electroplating solution 9 is deposited on a surface of first metal layer 1 and a surface of third metal layer 3 to form fourth metal layer 4 and fifth metal layer 5.

Then, second metal layer 2 after fourth metal layer 4 and fifth metal layer 5 are formed is extracted from electroplating solution 9, and ion exchanged water or the like is used to wash away electroplating solution 9 on fourth metal layer 4 and fifth metal layer 5. Then for example a predetermined acid is used for cleaning to remove oxide film formed on a surface of each of fourth metal layer 4 and fifth metal layer 5. The metal laminated structure of the second embodiment can thus be produced.

Hereinafter will be described another example of the method for producing the metal laminated structure of the second embodiment.

Figure 13:
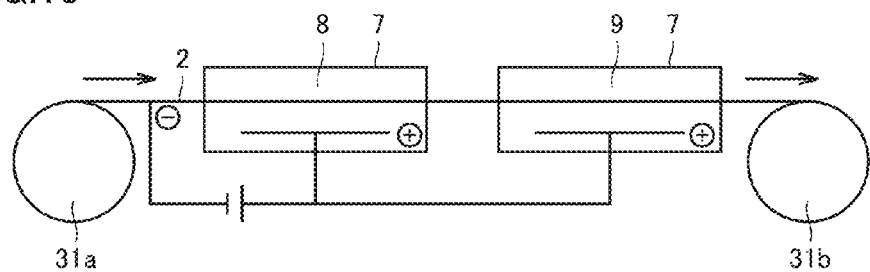
FIG. 13 schematically shows a configuration for illustrating another example of the method for producing the metal laminated structure of the second embodiment.

Initially, as shown in the schematic configuration of FIG. 13, second metal layer 2 of a copper foil or the like is bridged between a first roll 31a and a second roll 31b to pass through molten salt bath 8 accommodated in container 7 and electroplating solution 9 accommodated in container 7.

Then, second metal layer 2 is unrolled from first roll 31a and passed through molten salt bath 8 accommodated in container 7, while molten salt bath 8 is electrolyzed. Such molten salt bath plating allows tungsten to be deposited on the opposite surfaces of second metal layer 2 to form first metal layer 1 and third metal layer 3 on the opposite surfaces of second metal layer 2, respectively.

Then, second metal layer 2 after first metal layer 1 and third metal layer 3 are formed is passed through electroplating solution 9 accommodated in container 7, while electroplating solution 9 is electrolyzed. Such electroplating allows copper to be deposited on a surface of first metal layer 1 and that of third metal layer 3 to form fourth metal layer 4 and fifth metal layer 5 on the surface of first metal layer 1 and that of third metal layer 3, respectively, to produce the metal laminated structure of the second embodiment.

Then, the metal laminated structure of the second embodiment is wound up on second roll 31b and thus collected.

Note that while in the above description fourth metal layer 4 and fifth metal layer 5 are formed using electroplating solution 9, it is needless to say that fourth metal layer 4 and fifth metal layer 5 may be formed in any other method.

For example, sputtering or the like conventionally known vapor phase method may be employed to form fourth metal layer 4 and fifth metal layer 5.

Furthermore, fourth metal layer 4 and fifth metal layer 5 may be formed by a combination of formation by electrolyzing an electroplating solution, as described above, and formation by a vapor phase method such as sputtering or the like.

Furthermore, the metal laminated structure is not limited to the above 3-layer structure or 5-layer structure, and may be any structure of not less than 3 layers including first metal layer 1, second metal layer 2, and third metal layer 3, and inter alia, a structure of an odd number of layers is preferable.

The present embodiment except for the above description is similar to the first embodiment, and accordingly, will not be described repeatedly.

Third Embodiment

FIG. 14 is a schematic cross section of another example of the metal laminated structure of the present invention in a third embodiment. The metal laminated structure of the third embodiment is characterized by further having an adhesion layer 40 formed of a metal layer containing at least one type selected from the group consisting of cobalt (Co), nickel (Ni), chromium (Cr), and gold (Au) between first metal layer 1 and fourth metal layer 4 of the metal laminated structure of the second embodiment and between third metal layer 3 and fifth metal layer 5 of the metal laminated structure of the second embodiment.

Since adhesion strength between first metal layer 1 and fourth metal layer 4 and adhesion strength between third metal layer 3 and fifth metal layer 5 can be increased by providing such adhesion layer 40, the generation of peeling between layers can be reduced.

The metal laminated structure of the third embodiment can be produced for example as follows:

Initially, the metal laminated structure of the first embodiment is produced, as has been described above, and then first metal layer 1 and third metal layer 3 of the metal laminated structure of the first embodiment are immersed in an alkaline solution to degrease a surface of first metal layer 1 and a surface of third metal layer 3.

Subsequently, first metal layer 1 and third metal layer 3 as a positive electrode are immersed in an alkaline aqueous solution and, in that condition, electrolysis is performed to remove an oxide film on a surface of first metal layer 1 and an oxide film on a surface of third metal layer 3.

Then, first metal layer 1 and third metal layer 3 as a negative electrode after the above-mentioned oxide films are removed are immersed in a plating solution for example of an aqueous solution of cobalt sulfate and, in that condition, electrolysis is performed. This allows metal to be deposited on a surface of first metal layer 1 and on a surface of third metal layer 3 to form adhesion layer 40.

Then, adhesion layer 40 as a negative electrode produced as described above is immersed in a plating solution containing copper, such as a plating solution of copper sulfate or the like, and, in that condition, electrolysis is performed. This allows copper to be deposited on a surface of adhesion layer 40 to form fourth metal layer 4 containing copper and fifth metal layer containing copper. The metal laminated structure of the third embodiment can thus be produced.

The present embodiment except for the above description is similar to the first to third embodiments, and accordingly, will not be described repeatedly.

Fourth Embodiment

FIG. 15 is a schematic cross section of another example of the metal laminated structure of the present invention in a fourth embodiment. The metal laminated structure of the fourth embodiment is characterized by having a metal layer 41 containing nickel each on the surface of fourth metal layer 4 and on the surface of fifth metal layer 5 of the metal laminated structure of the second embodiment.

Since adhesion between layers and reliability can be increased by providing metal layer 41, resistance to working and resistance to thermal shock can be increased.

The metal laminated structure of the fourth embodiment can be produced for example by immersing the metal laminated structure of the second embodiment produced as described above in a plating solution containing nickel and, in that condition, performing electrolysis to deposit nickel on a surface of fourth metal layer 4 and on a surface of fifth metal layer 5 of the metal laminated structure of the second embodiment.

The present embodiment except for the above description is similar to the first to third embodiments, and accordingly, will not be described repeatedly.

EXAMPLES

Example 1

KF powder and $WO_3$ powder were sealed in a pressure resistant container, and thereafter the pressure resistant container was held at 500° C., and the pressure resistant container was internally vacuumed for not less than two days to dry the KF powder and the $WO_3$ powder.

Furthermore, 148 g of $B_2O_3$ powder was sealed in another pressure resistant container and thereafter the pressure resistant container was held at 380° C. and internally vacuumed for not less than two days to dry the $B_2O_3$ powder.

Figure 16:
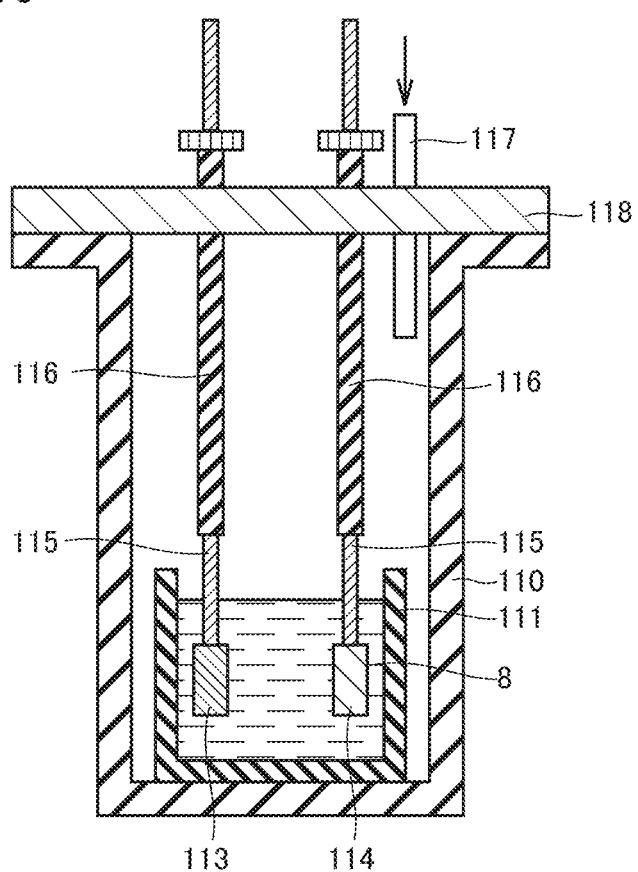
FIG. 16 schematically shows a configuration of equipment used in Examples 1-4 of the present invention.

Then the equipment shown in the schematic configuration in FIG. 16 was employed to melt a mixture of the dried KF powder, $B_2O_3$ powder, and $WO_3$ powder mixed at a molar ratio of 67:26:7 to prepare a molten salt bath.

More specifically, the dried KF powder, $B_2O_3$ powder and $WO_3$ powder were introduced at the above molar ratio into a crucible 111 formed of SiC which had been dried for not less than two days at 500° C., and crucible 111 with the powders introduced therein was sealed in a vacuum proof vessel 110 formed of quartz.

Subsequently, vacuum proof vessel 110 had an upper opening closed with a lid 118 formed of SUS316L, and, in that condition, crucible 111 was held at 500° C., and vacuum proof vessel 110 was internally vacuumed for not less than one day.

Subsequently, high purity argon gas was introduced into vacuum proof vessel 110 through a gas inlet 117 and crucible 111 was held at 850° C. to melt the above-mentioned powders to prepare molten salt bath 8.

Then, a rod electrode including a tungsten plate 113 (thickness: 2 mm, size: 5 cm square) as a positive electrode and a rod electrode including a copper plate 114 (thickness: 0.6 mm, size: 5 cm square) as a negative electrode were inserted through openings provided in lid 118, and tungsten plate 113 and copper plate 114 were immersed in molten salt bath 8 in crucible 111.

Herein, in the rod electrodes, a lead 115 is each connected to tungsten plate 113 and copper plate 114. As lead 115 internal to vacuum proof vessel 110 tungsten wire was implemented, and as lead 115 external to vacuum proof vessel 110 copper wire was implemented. Furthermore, at least a portion of lead 115 was covered with a covering material 116 formed of alumina.

Furthermore, when the rod electrodes were inserted, high purity argon gas was introduced into vacuum proof vessel 110 through gas inlet 117 to prevent atmospheric air from entering vacuum proof vessel 110.

Furthermore, in order to prevent introduction of impurity into molten salt bath 8 due to development of oxidization of tungsten plate 113 and copper plate 114, as shown in FIG. 16, the entire surface areas of tungsten plate 113 and copper plate 114 were immersed in molten salt bath 8.

Furthermore, the high purity argon gas was constantly introduced in crucible 111 to make an inert atmosphere in crucible 111. Then, in this inert atmosphere, with tungsten plate 113 serving as a positive electrode and copper plate 114 serving as a negative electrode, a current having a current density of 3 A/dm$^2$ was flowed between tungsten plate 113 and copper plate 114 for 150 minutes to perform constant current electrolysis of molten salt bath 8. As a result, a 25-μm-thick tungsten layer was formed on the opposite surfaces of copper plate 114.

Then copper plate 114 after the above-mentioned tungsten layer was formed was extracted from the equipment shown in FIG. 16 and the surface of the tungsten layer was cleaned with hot water to remove molten salt bath 8 on the tungsten layer to obtain a lamination of tungsten-copper-tungsten.

Subsequently, a counter electrode formed of a single sheet of copper containing phosphorus and the lamination of tungsten-copper-tungsten were immersed opposite to each other in a copper sulfate plating solution (Levco EX produced by Uyemura & CO., LTD.) in a Pyrex® beaker.

The copper sulfate plating solution was held at 30° C., and, in that condition, with the counter electrode as a positive electrode and the lamination of tungsten-copper-tungsten serving as a negative electrode, a current having a current density of 5 A/dm$^2$ was flowed between them for 195 minutes to perform electroplating. This allows copper to be deposited on a surface of the tungsten layer of the lamination of tungsten-copper-tungsten, and a metal laminated structure of Example 1 of a 5-layer structure of copper-tungsten-copper-tungsten-copper was thus produced.

Thermal conductivity (W/m·K) in a thickness direction of the metal laminated structure of Example 1 produced as described above was measured by a laser flash method. The result is shown in Table 1. As shown in Table 1, thermal conductivity in the thickness direction of the metal laminated structure of Example 1 was 369.0 (W/m·K).

A coefficient of linear expansion (ppm/° C.) in a horizontal direction of the metal laminated structure was measured. The result is shown in Table 1. As shown in Table 1, the coefficient of linear expansion in the horizontal direction of the metal laminated structure of Example 1 was 15.3 (ppm/° C.). Note that the measurement of the coefficient of linear expansion (ppm/° C.) in the horizontal direction was performed by calculating the average value from the values obtained by using a thermomechanical analyzer (TMA) in a range from room temperature to 150° C.

Figure 17:
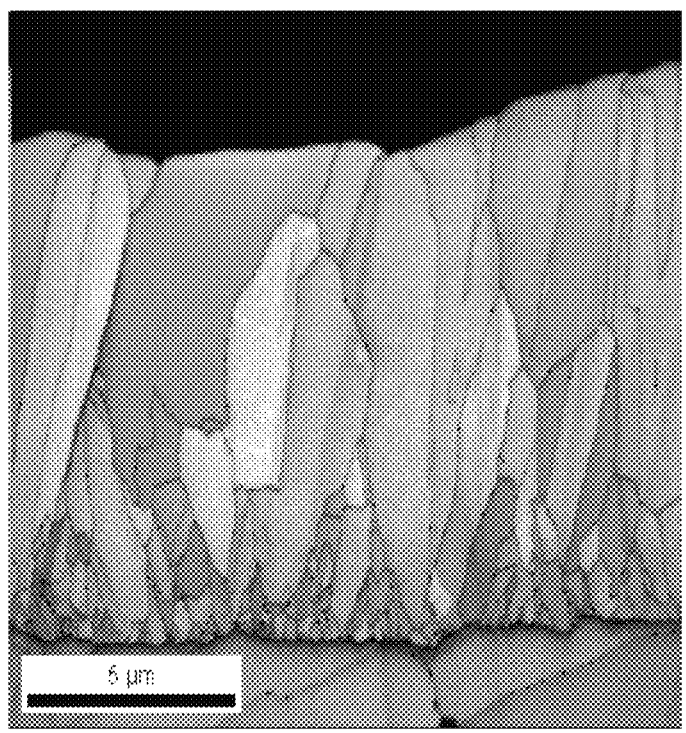
FIG. 17 is a photographical image of a metal laminated structure of Example 1 in a vicinity of an interface of a tungsten layer and a copper layer in a longitudinal cross section with low-speed SEM.
Figure 18:
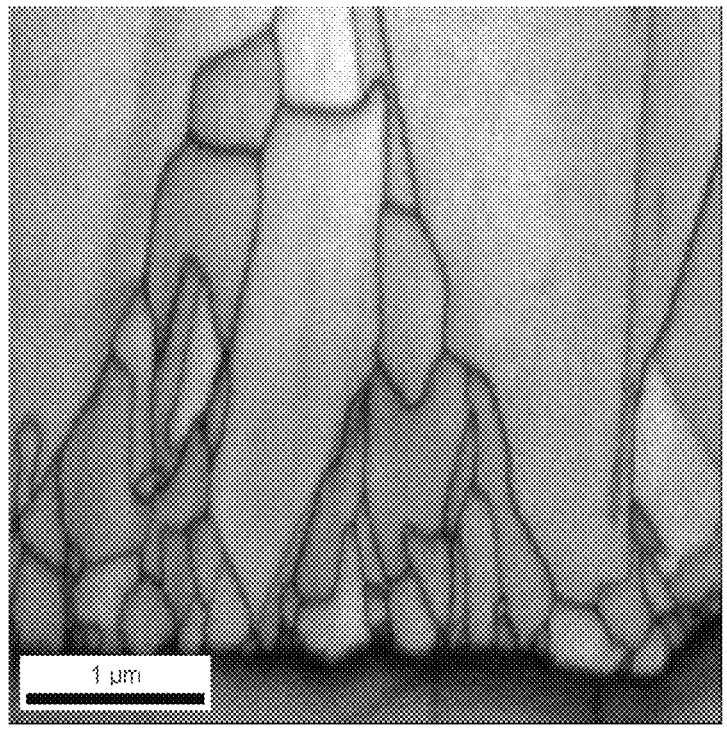
FIG. 18 is an enlarged photographical image of FIG. 17.
Figure 19:
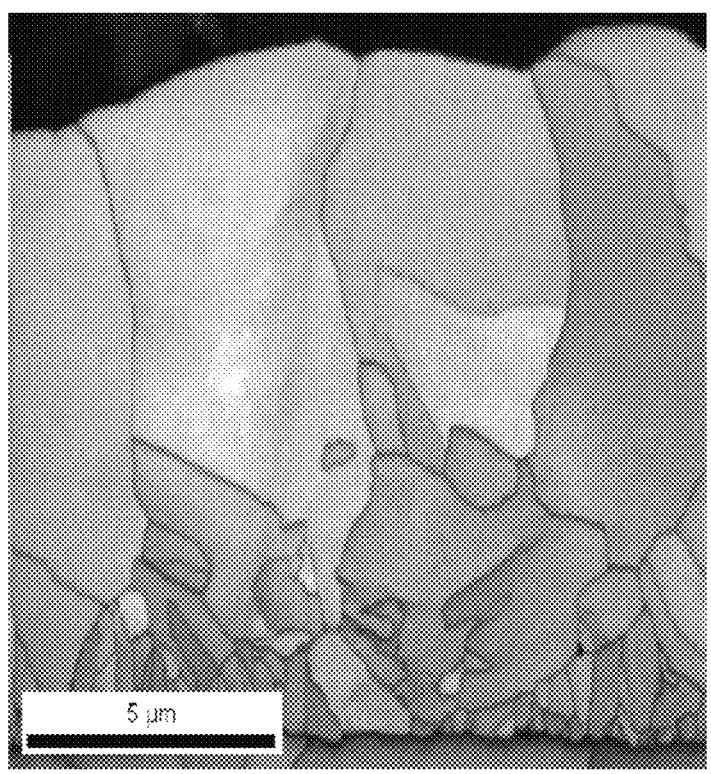
FIG. 19 is another photographical image of the metal laminated structure of Example 1 in a vicinity of an interface of a tungsten layer and a copper layer in a longitudinal cross section with low-speed SEM.

Furthermore, a cross section polisher was employed to expose a longitudinal cross section of the metal laminated structure of Example 1 and thereafter low accelerating voltage SEM was employed to observe the cross section. The result is shown in FIG. 17 to FIG. 19. FIG. 17 and FIG. 19 show a vicinity of an interface of the tungsten layer and a copper layer of the metal laminated structure of Example 1, and FIG. 18 shows an enlarged image of FIG. 17.

As shown in FIG. 17 to FIG. 19, it has been confirmed that crystal grains of tungsten configuring the tungsten layer of the metal laminated structure of Example 1 are each a columnar crystal extending from a surface of the copper layer in a direction nearly perpendicular to the surface of the copper layer.

Furthermore, any 10 crystal grains of tungsten were arbitrarily extracted from the longitudinal cross sections shown in FIG. 17 to FIG. 19 and each crystal grain's aspect ratio was calculated, and their average value was obtained as an aspect ratio of the metal laminated structure of Example 1. The result is shown in Table 1. As shown in Table 1, the aspect ratio of the metal laminated structure of Example 1 was 5.7. Note that the aspect ratio was calculated for each of arbitrarily extracted crystal grains of tungsten from a ratio (H/W) of a height H of the crystal grain in a direction vertical to the surface of the copper layer and a width W of the crystal grain in a direction parallel to the surface of the copper layer. Furthermore, it has also been confirmed in the metal laminated structure of Example 1 that crystal grains of tungsten having an aspect ratio larger than 1 occupy not less than 75% of the total number of the crystal grains of tungsten configuring the tungsten layer.

Furthermore, any area having a length of 500 μm was arbitrarily extracted from the longitudinal cross sections shown in FIG. 17 to FIG. 19 and in that area the number of voids each in the form of a recess with an opening having a size of not less than 1 μm was counted. The result is shown in Table 1. As shown in Table 1, the number of the voids of the metal laminated structure of Example 1 was 0.

Example 2

A metal laminated structure of Example 2 was produced in the same manner as Example 1 except that between tungsten plate 113 and copper plate 114 a current having a current density of 1 A/dm$^2$ was flowed for 450 minutes to perform constant-current electrolysis of molten salt bath 8 to deposit a 25-μm-thick tungsten layer on the opposite surfaces of copper plate 114.

Thermal conductivity (W/m·K) in a thickness direction, a coefficient of linear expansion (ppm/° C.) in a horizontal direction, an aspect ratio and the number of the voids of the metal laminated structure of Example 2 produced as described above were measured in the same manner as the metal laminated structure of Example 1. The result is shown in Table 1.

As shown in Table 1, in the metal laminated structure of Example 2, thermal conductivity (W/m·K) in the thickness direction was 371.2 (W/m·K) and the coefficient of linear expansion (ppm/° C.) in the horizontal direction was 15.1 (ppm/° C.) and the aspect ratio was 3.4 and the number of the voids was 0. Furthermore, it has also been confirmed in the metal laminated structure of Example 2 that crystal grains of tungsten having an aspect ratio larger than 1 occupy not less than 55% of the total number of the crystal grains of tungsten configuring a tungsten layer.

Example 3

A metal laminated structure of Example 3 was produced in the same manner as Example 1 except that between tungsten plate 113 and copper plate 114 a current having a current density of 6 A/dm$^2$ was flowed for 75 minutes to perform constant-current electrolysis of molten salt bath 8 to deposit a 25-μm-thick tungsten layer on the opposite surfaces of copper plate 114.

Thermal conductivity (W/m·K) in a thickness direction, a coefficient of linear expansion (ppm/° C.) in a horizontal direction, an aspect ratio and the number of the voids of the metal laminated structure of Example 3 produced as described above were measured in the same manner as the metal laminated structure of Example 1. The result is shown in Table 1.

As shown in Table 1, in the metal laminated structure of Example 3, thermal conductivity (W/m·K) in the thickness direction was 367.0 (W/m·K) and the coefficient of linear expansion (ppm/° C.) in the horizontal direction was 15.4 (ppm/° C.) and the aspect ratio was 7.3 and the number of the voids was 1. Furthermore, it has also been confirmed in the metal laminated structure of Example 3 that crystal grains of tungsten having an aspect ratio larger than 1 occupy not less than 80% of the total number of the crystal grains of tungsten configuring a tungsten layer.

Example 4

A lamination of tungsten-copper-tungsten was produced, as done in Example 1, and subsequently electroplated to have a nickel layer on the surfaces of the tungsten layers formed on the opposite surfaces of copper plate 114.

The lamination was electroplated to have the nickel layer, as follows: Initially, a counter electrode in the form of a single nickel plate and the lamination of tungsten-copper-tungsten were immersed opposite to each other in a nickel plating solution having a hydrochloric acid concentration of 100 g/L and a nickel chloride concentration of 250 g/L in a Pyrex® beaker.

Then, with the counter electrode as a positive electrode and the lamination of tungsten-copper-tungsten as a negative electrode, a current having a current density of 10 A/dm² was flowed between them for 3 minutes to perform electroplating at room temperature.

This allows nickel to be deposited on the opposite surfaces of the lamination of tungsten-copper-tungsten to form an adhesion layer formed of nickel of 0.1 μm in thickness and thus form a lamination of nickel-tungsten-copper-tungsten-nickel.

Thereafter, in the same way as Example 1, a copper sulfate plating solution was employed to perform electroplating to deposit copper on the respective surfaces of the adhesion layers formed of nickel to form a lamination of copper-nickel-tungsten-copper-tungsten-nickel-copper to produce the metal laminated structure of Example 4.

Thermal conductivity (W/m·K) in a thickness direction, a coefficient of linear expansion (ppm/° C.) in a horizontal direction, an aspect ratio and the number of the voids of the metal laminated structure of Example 4 produced as described above were measured in the same manner as the metal laminated structure of Example 1. The result is shown in Table 1.

As shown in Table 1, in the metal laminated structure of Example 4, thermal conductivity (W/m·K) in the thickness direction was 366.7 (W/m·K) and the coefficient of linear expansion (ppm/° C.) in the horizontal direction was 15.3 (ppm/° C.) and the aspect ratio was 5.4 and the number of the voids was 0. Furthermore, it has also been confirmed in the metal laminated structure of Example 4 that crystal grains of tungsten having an aspect ratio larger than 1 occupy not less than 73% of the total number of the crystal grains of tungsten configuring a tungsten layer.

Comparative Example 1

A 600-μm-thick copper plate was prepared and on its opposite surfaces a 25-μm-thick commercially available rolled tungsten foil was provided, and furthermore, on the opposite rolled tungsten foils' respective surfaces a 200-μm-thick copper plate was provided to produce a lamination.

Thereafter, the lamination produced as described above was held for 10 minutes at 900° C. within a furnace having an atmosphere of hydrogen therein, and thereafter, pressure of 10 MPa was applied to perform hot pressing of it to produce a lamination of a 5-layer structure of copper-tungsten-copper-tungsten-copper as a metal laminated structure of a Comparative Example 1.

Thermal conductivity (W/m·K) in a thickness direction, a coefficient of linear expansion (ppm/° C.) in a horizontal direction, an aspect ratio and the number of the voids of the metal laminated structure of Comparative Example 1 produced as described above were measured in the same manner as the metal laminated structure of Example 1. The result is shown in Table 1.

As shown in Table 1, in the metal laminated structure of Comparative Example 1, thermal conductivity (W/m·K) in the thickness direction was 355.0 (W/m·K) and the coefficient of linear expansion (ppm/° C.) in the horizontal direction was 15.7 (ppm/° C.) and the aspect ratio was 0.1 and the number of the voids was 12. Furthermore, it has also been confirmed in the metal laminated structure of Comparative Example 1 that crystal grains of tungsten having an aspect ratio larger than 1 occupy not less than 12% of the total number of the crystal grains of tungsten configuring a tungsten layer.

Comparative Example 2

A metal laminated structure of a Comparative Example 2 formed of a lamination having a 5-layer structure of copper-molybdenum-copper-molybdenum-copper was produced in the same manner as Example 1 except that the 25-μm-thick commercially available rolled tungsten foil was replaced with a 25-μm-thick commercially available rolled molybdenum foil.

Thermal conductivity (W/m·K) in a thickness direction, a coefficient of linear expansion (ppm/° C.) in a horizontal direction and the number of the voids of the metal laminated structure of Comparative Example 2 produced as described above were measured in the same manner as the metal laminated structure of Example 1. The result is shown in Table 1. Note that the metal laminated structure of comparative example 2 was not measured for an aspect ratio of a crystal grain of molybdenum configuring the molybdenum layer.

As shown in Table 1, in the metal laminated structure of Comparative Example 2, thermal conductivity (W/m·K) in the thickness direction was 345.0 (W/m·K) and the coefficient of linear expansion (ppm/° C.) in the horizontal direction was 16.0 (ppm/° C.) and the number of the voids was 7.

TABLE 1

|  | Example 1 | Example 2 | Example 3 | Example 4 | Comparative Example 1 | Comparative Example 2 |
|---|---|---|---|---|---|---|
| Method for Production | Electroplating | Electroplating | Electroplating | Electroplating | Hot Pressing | Hot Pressing |
| Laminated Structure (Material: Thickness ($\mu$m)) | — Cu: 200 W: 25 Cu: 600 W: 25 Cu: 200 — | — Cu: 200 W: 25 Cu: 600 W: 25 Cu: 200 — | — Cu: 200 W: 25 Cu: 600 W: 25 Cu: 200 — | Cu: 200 Ni: 0.1 W: 25 Cu: 600 W: 25 Ni: 0.1 Cu: 200 | — Cu: 200 W: 25 Cu: 600 W: 25 Cu: 200 — | — Cu: 200 Mo: 25 Cu: 600 Mo: 25 Cu: 200 — |
| Current Density in Molten Salt Plating (A/dm$^2$) | 3 | 1 | 6 | 3 | — | — |
| Molten Salt Plating Time (min.) | 150 | 450 | 75 | 150 | — | — |
| Number of Voids | 0 | 0 | 1 | 0 | 12 | 7 |
| Ratio of Crystal Grains of Tungsten Having an Aspect Ratio Larger than 1 | not less than 75% | not less than 55% | not less than 80% | not less than 73% | 12% | — |
| Thermal Conductivity in Thickness Direction (W/m · K) | 369.0 | 371.2 | 367.0 | 366.7 | 355.0 | 345.0 |
| Coefficient of Linear Expansion in Horizontal Direction (ppm/K) | 15.3 | 15.1 | 15.4 | 15.3 | 15.7 | 16.0 |

As shown in Table 1, in the metal laminated structures of Examples 1 to 4, the tungsten layer of which was formed by molten salt plating, the aspect ratios of crystal grains of tungsten configuring the tungsten layer are 3.4 to 5.7. Furthermore, in the metal laminated structures of Examples 1 to 4, crystal grains of tungsten having an aspect ratio larger than 1 occupy not less than 50% of the total number of the crystal grains of tungsten configuring the tungsten layer.

Furthermore, as shown in Table 1, in the metal laminated structure of Comparative Example 1 having a tungsten layer formed by hot pressing, the aspect ratio of crystal grains of tungsten was 0.1. Furthermore, in the metal laminated structure of Comparative Example 1, crystal grains of tungsten having an aspect ratio not more than 1 occupy not less than 50% of the total number of the crystal grains of tungsten configuring the tungsten layer.

Thus when the metal laminated structures of Examples 1 to 4 in which crystal grains of tungsten having an aspect ratio larger than 1 occupy not less than 50% of the total number of the crystal grains of tungsten configuring the tungsten layer are compared with the metal laminated structure of Comparative Example 1 in which crystal grains of tungsten having an aspect ratio of not more than 1 occupy not less than 50% of the total number of the crystal grains of tungsten configuring the tungsten layer, it has been confirmed that the former has a reduced coefficient of linear expansion (ppm/° C.) in the horizontal direction.

Furthermore, as shown in Table 1, in the metal laminated structures of Examples 1 to 4 having a tungsten layer formed by molten salt plating, the number of the voids having an opening having a size of not less than 1 $\mu$m in any area having a length of 500 $\mu$m arbitrarily extracted from a longitudinal cross section of the crystal grains of tungsten configuring the tungsten layer was 0 to 1.

Furthermore, as shown in Table 1, in the metal laminated structure of Comparative Example 1 having a tungsten layer formed by hot pressing, the number of the voids having an opening having a size of not less than 1 $\mu$m in any area having a length of 500 $\mu$m arbitrarily extracted from a longitudinal cross section of the crystal grains of tungsten configuring the tungsten layer was 12.

Thus the metal laminated structures of Examples 1 to 4 the number of the voids of which is 0 to 1 had higher thermal conductivity (W/m·K) in the thickness direction than Comparative Examples 1 and 2 the number of the voids of which is 12.

Furthermore, as shown in Table 1, when the metal laminated structures of Examples 1 to 4 having a tungsten layer formed by molten salt plating were compared with the metal laminated structure of Comparative Example 2 having a molybdenum layer formed by hot pressing, the former had a more reduced coefficient of linear expansion in the horizontal direction and higher thermal conductivity (W/m·K) in the thickness direction than the latter.

It has thus been confirmed that when the metal laminated structures of Examples 1 to 4 having a tungsten layer formed by molten salt plating are compared with the metal laminated structure of Comparative Example 1 having a tungsten layer formed by hot pressing, the former can have an increased thermal conductivity (W/m·K) in the thickness direction and a reduced coefficient of linear expansion (ppm/° C.) in the horizontal direction.

It is believed that this is because when the metal laminated structures of Examples 1 to 4 having a tungsten layer formed by molten salt plating were compared with the metal laminated structures of Comparative Examples 1 and 2 having a tungsten layer or a molybdenum layer formed by hot pressing, the former had the tungsten layer configured of crystal grains of tungsten having a larger aspect ratio than the latter and thus reduced formation of voids.

It should be understood that the embodiments and examples disclosed herein are illustrative and non-restrictive in any respect. The scope of the present invention is defined by the terms of the claims, rather than the description above, and is intended to include any modifications within the scope and meaning equivalent to the terms of the claims.

INDUSTRIAL APPLICABILITY

The present metal laminated structure and the present method for producing the same are applicable for example to a heat sink of a semiconductor device.

REFERENCE SIGNS LIST

1: first metal layer; 1a: tungsten grain; 1b: void; 2: second metal layer; 2a: first surface; 2b: second surface; 3: third metal layer; 3a: tungsten grain; 3b: void; 4: fourth metal layer; 5: fifth metal layer; 6: counter electrode; 7: container; 8: molten salt; 9: electroplating solution; 10: LED structure; 11: p-type semiconductor layer; 12: active layer; 13: n-type semiconductor layer; 14: semiconductor substrate; 15: p electrode; 16: n electrode; 17: semi-transparent electrode; 21: joining layer; 31a: first roll; 31b: second roll; 40: adhesion layer; 41: metal layer; 100: metal laminated structure; 110: vacuum proof vessel; 111: crucible; 113: tungsten plate; 114: copper plate; 115: lead; 116: covering material; 117: gas inlet; 118: lid.

The invention claimed is:

1. A metal laminated structure comprising a first metal layer containing tungsten, a second metal layer containing copper, and a third metal layer containing tungsten,
   said first metal layer being provided on a first surface of said second metal layer,
   said third metal layer being provided on a second surface of said second metal layer opposite to said first surface,
   said first metal layer containing crystal grains of said tungsten in a form of a columnar crystal extending in a direction perpendicular to said first surface of said second metal layer,
   said third metal layer containing crystal grains of said tungsten in a form of a columnar crystal extending in a direction perpendicular to said second surface of said second metal layer.

2. The metal laminated structure according to claim 1, wherein said first metal layer and said third metal layer are not less than 1 µm and not more than 200 µm in thickness.

3. The metal laminated structure according to claim 1, wherein the number of voids of not less than 1 µm is not more than 2 in an area having a length of 500 µm in a longitudinal cross section of said metal laminated structure.

4. The metal laminated structure according to claim 1, wherein said metal laminated structure includes an odd number of layers not less than 3 layers.

5. The metal laminated structure according to claim 1, further comprising a metal layer containing at least one type selected from the group consisting of cobalt, nickel, chromium, and gold.

6. The metal laminated structure according to claim 1, wherein an outermost surface of said metal laminated structure includes a metal layer containing copper.

7. The metal laminated structure according to claim 1, wherein an outermost surface of said metal laminated structure includes a metal layer containing nickel and a metal layer containing copper is provided at an inner side of said metal layer containing nickel.

8. A method for producing a metal laminated structure, comprising the steps of:
   depositing a first metal layer containing tungsten on a first surface of a second metal layer containing copper by molten salt bath plating; and
   depositing a third metal layer containing tungsten on a second surface of said second metal layer opposite to said first surface by molten salt bath plating.

* * * * *